(12) United States Patent
Philbert (10) Patent No.: US 9,818,179 B2
(45) Date of Patent: Nov. 14, 2017

(54) METHOD FOR MANUFACTURING A WIRE HARNESS

(71) Applicant: Bombardier Transportation GmbH, Berlin (DE)

(72) Inventor: Luc Philbert, St-Bruno (CA)

(73) Assignee: Bombardier Transportation GmbH, Berlin (DE)

( * ) Notice: Subject to any disclaimer, the term of this patent is extended or adjusted under 35 U.S.C. 154(b) by 900 days.

(21) Appl. No.: 14/097,619

(22) Filed: Dec. 5, 2013

(65) Prior Publication Data

US 2015/0161781 A1   Jun. 11, 2015

(51) Int. Cl.
  *G06T 7/00* (2017.01)
  *G06F 17/50* (2006.01)
  *H01B 13/012* (2006.01)

(52) U.S. Cl.
  CPC ............ *G06T 7/0004* (2013.01); *G06F 17/50* (2013.01); *G06T 2207/30108* (2013.01); *H01B 13/01227* (2013.01)

(58) Field of Classification Search
  None
  See application file for complete search history.

(56) References Cited

U.S. PATENT DOCUMENTS

| 2,805,471 | A |   | 9/1957 | Lowden |
| 4,190,890 | A | * | 2/1980 | Marx ............... H01B 13/01227 29/720 |
| 5,127,062 | A |   | 6/1992 | Cerda |
| 5,659,954 | A |   | 8/1997 | Ikeda et al. |
| 6,169,934 | B1 |   | 1/2001 | Nakayama et al. |
| 6,272,387 | B1 |   | 8/2001 | Yoon |
| 6,530,677 | B1 |   | 3/2003 | Mori et al. |
| 8,066,383 | B2 |   | 11/2011 | Lin |
| 2003/0163917 | A1 | * | 9/2003 | Davidshofer ....... B60R 16/0207 29/854 |
| 2007/0277372 | A1 | * | 12/2007 | Aida ..................... H01R 43/28 29/747 |
| 2014/0145128 | A1 | * | 5/2014 | Durand .................... H02G 1/00 254/134.3 R |

FOREIGN PATENT DOCUMENTS

CN   101083161 A   12/2007

OTHER PUBLICATIONS

Brochure "Interactive wire harness board"; May 25, 2013; 2 pages; Laselec SA; 15 rue Boudeville, 31100 Toulouse—France; Laselec Inc; 2605 N. Forum Dr; Grand Prairie, TX—75052—USA.

* cited by examiner

*Primary Examiner* — Wissam Rashid
(74) *Attorney, Agent, or Firm* — The Webb Law Firm (57) ABSTRACT

A method for assembling a wire harness on a display surface, the wire harness comprising bundles, each one of which corresponds to a bundle route selected among possible bundle routes and each one of the possible bundle routes comprising two ends. The method comprises receiving coordinates of a layout of the wire harness; generating at least a portion of all the possible bundle routes by identifying coordinates of portions of each of the two ends from the coordinates of the layout of the wire harness. Then determining which bundle routes among the possible bundle routes correspond to the bundles to be used. Defining, from the coordinates, a sequence in which the bundles are to be routed and generating a plurality of signals. Finally sending each one of the signals for display sequentially on the display surface according to the defined sequence.

19 Claims, 11 Drawing Sheets

METHOD FOR MANUFACTURING A WIRE HARNESS

BACKGROUND (a) Field

The subject matter disclosed generally relates to methods for electrical circuit manufacturing. More specifically, the subject matter relates to methods for wire harness manufacturing.

(b) Related Prior Art

Existing methods for manufacturing a wire harness comprise one or several tables or panels on which a large paper sheet is laid down, the paper sheet displaying a two-dimensional layout for manufacturing the harness. This large sheet of paper needs to be printed and placed on the tables so the person manufacturing the harness has clear instructions about how to build the harness. However, all these steps are time-consuming. If a modification to the 2D layout occurs, the large sheet has to be printed again and replaced, which is inefficient.

Moreover, in existing methods, the second step of assembling terminals at the ends of bundles that make up a wire harness can only be done once the first step of routing of the bundles has been completed. If those steps could be done in parallel rather than sequentially, the assembly method would gain in efficiency.

There is thus a need for a tool and method for manufacturing wire harnesses that are more efficient than current tools and methods.

SUMMARY

The embodiments described herein provide a method for assembling harnesses that overcomes or mitigates one or more disadvantages of known methods, or at least provides a useful alternative.

The methods and systems described herein provide the advantages of decreasing a worker's traveling distance and assembly time to assemble a harness.

The methods and systems described herein also provide the advantage of decreasing a risk of error in assembling the harness.

The methods and systems described herein also decrease a learning curve for assembling the harness.

There is provided a method for assembling a wire harness on a display surface, the wire harness comprising bundles, each one of the bundles corresponding to a bundle route selected among possible bundle routes, each one of the possible bundle routes comprising two ends, the method comprising: receiving coordinates of a layout of the wire harness; generating at least a portion of all the possible bundle routes by identifying coordinates of the two ends of each one of the at least a portion of all the possible bundle routes from the coordinates of the layout of the wire harness; receiving wiring data which identifies the bundles to be used for the wire harness; determining which bundle routes among the possible bundle routes correspond to the bundles to be used; defining, from the coordinates of the two ends of the determined bundle routes, a sequence in which the bundles are to be routed to produce the wire harness; generating a plurality of signals, each one of the plurality of signals being representative of an image of the bundle route for a corresponding one of the bundles to be routed; and sending each one of the plurality of signals for display sequentially on the display surface according to the defined sequence.

According to another embodiment, the method further comprising sending for display on the display surface a signal representative of an image of the harness without any bundle route.

According to another embodiment, generating at least a portion of all the possible bundle routes comprises generating the possible bundle routes by identifying coordinates of intermediate points of the at least a portion of all the possible bundle routes from the coordinates.

According to another embodiment, generating the possible bundle routes further comprises defining vectors between at least one of: end points and intermediate points; two intermediate points; and two end points.

According to another embodiment, generating a plurality of signals comprises modifying each one of the plurality of signals into a plurality of secondary signals, each one of the plurality of secondary signals being representative of a different portion of the image of the bundle route, said method further comprising displaying said plurality of secondary signals on a corresponding plurality of adjacent display surfaces.

According to another embodiment, sending the plurality of signals for display on the display surface comprises sending the plurality of signals for display on a projection table.

According to another embodiment, the method further comprises, after each sending each one of the plurality of signals for display, routing a corresponding one of the bundles on the bundle route displayed on the display surface, wherein routing is performed by a worker.

According to another embodiment, the wire harness further comprises ends, the method further comprising installing a terminal at one of the ends of the wire harness after all the bundles linked to the one of the ends of the wire harness have been routed.

According to another embodiment, sending the plurality of signals for display comprises sending the plurality of signals from a computing device in a server location to a projector in a site, wherein the server location is remote from the site.

According to another embodiment, receiving the coordinates comprises generating the coordinates.

According to another embodiment, receiving the coordinates comprises receiving coordinates of the first end and of the second end of each one of the bundle routes from a layout of the wire harness, the coordinates comprising, for each first end and each second end, a first dimension coordinate and a second dimension coordinate in relation to a reference point, and wherein defining the sequence comprises: sorting the bundle routes in an ascending order of the first dimension coordinate of the first end of each one of the bundle routes; for those bundle routes which have the same first dimension coordinate of the first end, sorting those bundle routes in an ascending order of the second dimension coordinate of the first end; for those bundle routes which have the same first dimension coordinate and the same second dimension coordinate of the first end, sorting those bundle routes in an ascending order of the first dimension coordinate of the second end; and for those bundle routes which have the same first dimension coordinate and the same second dimension coordinate of the first end, and the same first dimension coordinate of the second end, sorting those bundle routes in an ascending order of the second dimension coordinate of the second end.

In another aspect of the invention, there is provided a method for defining a sequence of bundles for assembling a wire harness on a display surface, the wire harness comprising the bundles, each one of the bundles corresponding to a bundle route which comprises a first end and a second end, the method comprising: receiving coordinates of the first end and of the second end of each one of the bundle routes from a layout of the wire harness, the coordinates comprising, for each first end and each second end, a first dimension coordinate and a second dimension coordinate in relation to a reference point; and defining the sequence, the defining comprising: sorting the bundle routes in an ascending order of the first dimension coordinate of the first end of each one of the bundle routes; for those bundle routes which have the same first dimension coordinate of the first end, sorting those bundle routes in an ascending order of the second dimension coordinate of the first end; for those bundle routes which have the same first dimension coordinate and the same second dimension coordinate of the first end, sorting those bundle routes in an ascending order of the first dimension coordinate of the second end; and for those bundle routes which have the same first dimension coordinate and the same second dimension coordinate of the first end, and the same first dimension coordinate of the second end, sorting those bundle routes in an ascending order of the second dimension coordinate of the second end.

According to another embodiment, the method further comprises using a projector for optically projecting, on the display surface, one image representative of a bundle route at a time in the defined sequence.

In another aspect of the invention, there is provided a system for assembling a wire harness comprising a plurality of bundles to be routed, each one of the bundles being defined by a corresponding one bundle route, the system comprising: a display surface which comprises a surface on which the wire harness is assembled; a projector for projecting, for each one of the bundles to be routed, an image of the corresponding one bundle route on the display surface in a sequence in which the bundles are to be routed to produce the wire harness; and a computing device for: determining, for each one of the bundles to be routed, the corresponding one bundle route; defining the sequence in which the bundles are to be routed; and sending to the projector, for each one of the bundles to be routed, a signal representative of an image of the corresponding one bundle route.

According to another embodiment, the computing device is further for sending a plurality of secondary signals for each bundle, each one of the plurality of secondary signals being representative of a different portion of the image of the corresponding one bundle route, for display of said plurality of secondary signals on a corresponding plurality of adjacent display surfaces.

According to another embodiment, the computing device is located in a server location and the projector and the display surface are located in a site, the server location being remote from the site.

According to another embodiment, the display surface comprises a projection table comprising a surface that is planar and substantially vertically positioned.

According to another embodiment, the surface comprises two sides which are both used for assembling wire harnesses.

In another aspect of the invention, there is provided a method for assembling a wire harness on a display surface, the wire harness comprising bundles, each one of the bundles comprising two ends, the method comprising: sending for display sequentially on the display surface a plurality of generated signals according to a bundle assembly sequence defined from coordinates of the two ends of bundle routes generated from coordinates of a layout of the harness, each one of the plurality of generated signals being representative of an image of the bundle route for a corresponding one of the bundles.

In another aspect of the invention, there is provided a method for assembling a wire harness on a display surface, the wire harness comprising bundles, each one of the bundles comprising two ends comprising coordinates, the method comprising: defining, from the coordinates of the two ends of the bundles, a sequence in which the bundles are to be routed to produce the wire harness, the coordinates being identified from a layout of the wire harness, the sequence comprising ordering the bundles in order of ascending path length.

Definitions

A bundle (aka a wire bundle) is an assembly of wires having the same length and going from an end point to another end point.

A harness (aka a wire harness) is an assembly of bundles.

A bundle route is the route or path taken by a bundle. The bundle route may be defined by the coordinates of its first end point and its second end points. According to an embodiment, the bundle route may be further defined by the coordinates of one or more intermediate points.

A display surface is a device comprising a surface such as a table or panel on which a harness assembly 2D layout is displayed. If the display surface is a table, it may be called a projection table. According to an embodiment, the projection table comprises a substantially flat surface and is typically substantially vertically positioned, although curved or broken surfaces and various inclinations (e.g. horizontal) may be used in other embodiments.

A site refers to a place where the work required in the method described herein is done, such as a plant, a workshop, or an office.

The term "sequentially" is intended to mean "one at a time", or "a few at a time". The expression "sequentially sending the plurality of images or signals" thus means "sending one image or signal at a time", or "a few images or signals at a time".

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments may be readily combined, without departing from the scope or spirit thereof. The terms "comprising" and "including" should be interpreted to mean: including but not limited to.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

Features and advantages of the subject matter hereof will become more apparent in light of the following detailed description of selected embodiments, as illustrated in the accompanying figures. As will be realized, the subject matter disclosed and claimed is capable of modifications in various respects, all without departing from the scope of the claims. Accordingly, the drawings and the description are to be regarded as illustrative in nature, and not as restrictive and the full scope of the subject matter is set forth in the claims.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

The embodiments will now be described more fully hereinafter with reference to the accompanying drawings, which form a part hereof, and which show, by way of illustration, specific embodiments by which the embodiments may be practiced as will be understood by those skilled in the art. The embodiments may, however, be embodied in many different forms and should not be construed as limited to the embodiments set forth herein.

Among other things, the present embodiments may be embodied as methods or devices. Accordingly, the embodiments may take the form of an entirely hardware embodiment, an entirely software embodiment, an embodiment combining software and hardware aspects, etc. Furthermore, although the embodiments are described with reference to a portable or handheld device, they may also be implemented on desktops, laptop computers, tablet devices or any computing device having sufficient computing resources to implement the embodiments.

Briefly stated, the present embodiments describe a method for assembling a wire harness. Since harnesses found in the transportation industry (for example trains or aircraft) are very long, a long or large flat surface on which lay both the harness under assembly and its assembly plan is usually required for their assembly. In the method described herein, the flat surface acts as a display surface and is generally called a projection table because the 2D layouts of harnesses are optically projected on the projection table.

Figure 1:
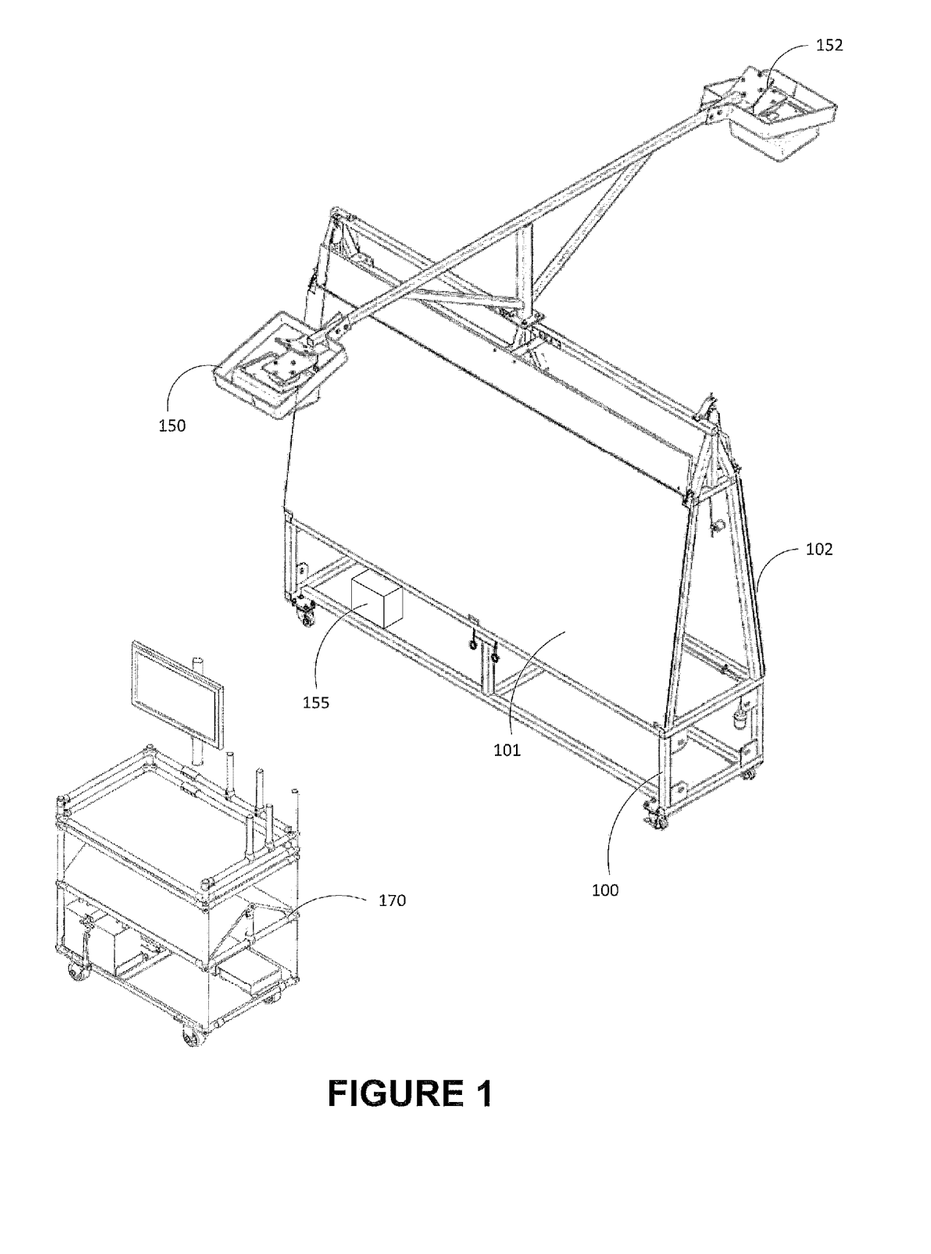
FIG. 1 is a perspective view illustrating a projection table and a projector in accordance with an embodiment.

FIG. 1 illustrates a projection table 100 according to an embodiment. The projection table 100 comprises at least one screen 101 on which a harness may be assembled. A projector 150, connected to a computer 155, optically projects assembly instructions and a 2D layout on the screen 101 of the projection table 100. It is possible to add one or more additional screen 102, in which case a supplementary projector 152 is required for each additional screen 102. As illustrated in FIG. 1, the projection table 100 comprises two screens 101, 102 which can be used for the assembly of two harnesses, either of the same model or of two different models. Indeed, the projectors 150, 152 may project two different 2D layouts for the assembly of two different models of harnesses. More generally, the projection table 100 may be described as a display surface. It may comprise a planar surface acting as the screen 101, and an additional side having a planar surface may act as the screen 102.

Figure 2A:
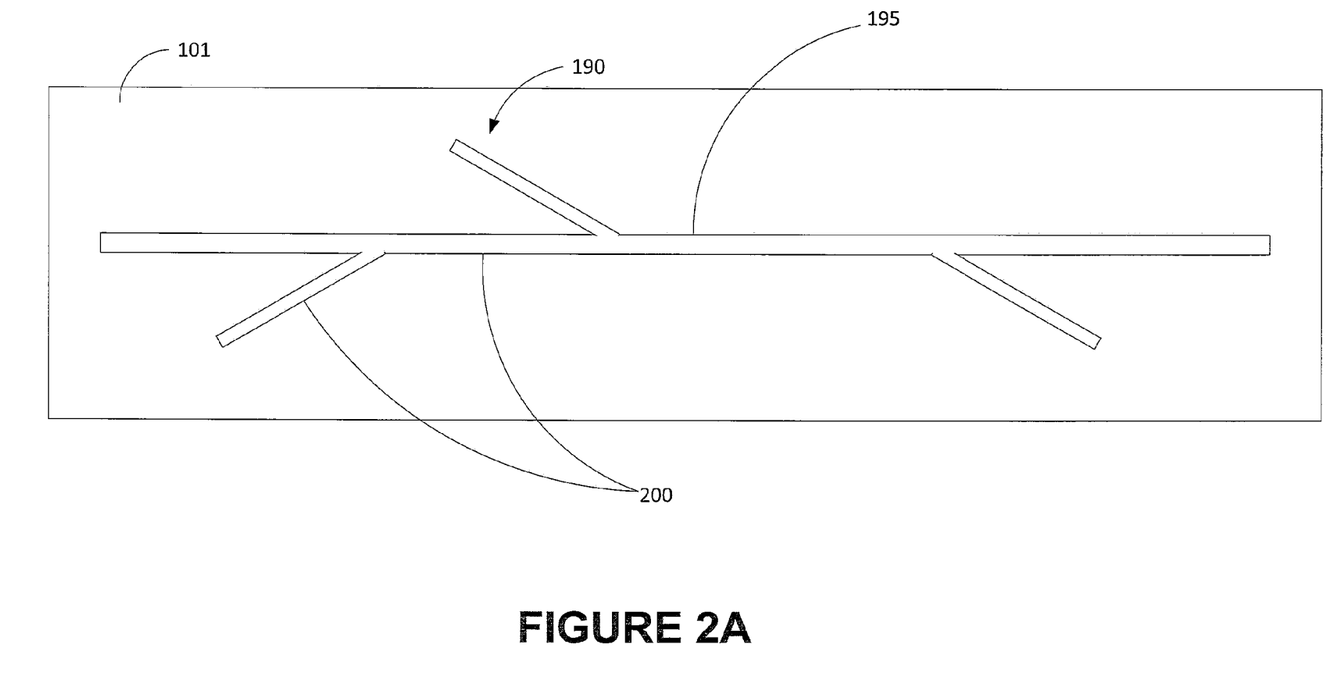
FIG. 2A is a front view illustrating two projection tables of FIG. 1 placed side by side on which is displayed an empty 2D layout in accordance with an embodiment.
Figure 2B:
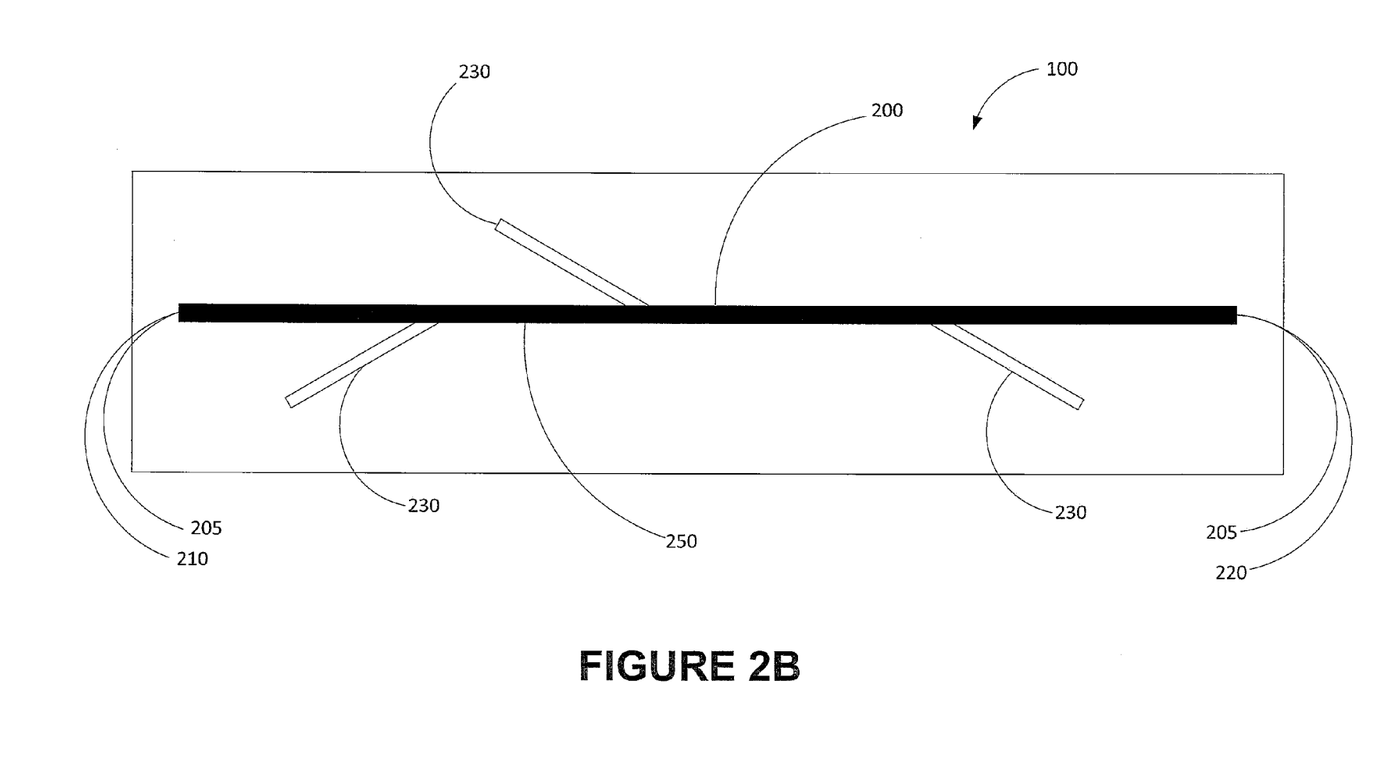
FIG. 2B is a front view illustrating the two projection tables of FIG. 2A where a wire harness is being built in accordance with an embodiment.

The computer 155 may be locally installed on the projection table 100 or can be remotely located while still being connected, wirelessly or not, to the projector 150. The computer 155 may control only projector 150 or both projectors 150 and 152. Furthermore, if the projected 2D layout is larger than the projection table 100, as shown in FIGS. 2A and 2B, a plurality of projection tables 100 may be aligned so that the 2D layout is completely projected on the projection tables 100. In this case, the computer 155 may control all the aligned projection tables 100.

The projection table 100 may be accompanied by a cart 170. The cart 170 is used to carry all the terminals (aka connectors), pins and other hardware necessary to complete the manufacturing of the ends of a harness. The cart 170 may be connected to the computer 155 so as to display through the projector 150, information related to the completion of the ends of the harness.

The projection table 100 may be of various lengths, depending on requirements and technology. For example, aircraft or rail vehicles may be quite long, from a few tens of feet for smaller rail vehicles to hundreds of feet for large aircraft. Manufacturing a harness for these vehicles requires a projection table that is as long as the vehicle, or even longer. However, it may not be practical for storage purposes to use such a long projection table, or there may not exist a projector capable of projecting an image on such a long area. Consequently, for practical reasons, it is possible to adjacently assemble many projection tables 100 so as to extend the full required length. For the benefit of the present description, a projection table assembly represents one or more projection tables 100 in such an arrangement.

The adjacent display surfaces may thus be used for representing a different portion of a bundle route on each adjacent display surface. In that case, the signal representative of an image of a bundle route has to be split into a plurality of secondary signals, each one being representative of a portion of a bundle route.

FIG. 2A is a front view of the screen 101 of the projection table 100 on which a 2D layout 190 of a harness to be assembled is projected. The 2D layout 190 shows an empty image of a harness 195 to be made of several bundles 200.

During the assembly, only one of the bundles 200 is routed at a time. FIG. 2B shows a first bundle 200 being assembled over the image of the 2D layout 190 projected on the screen 101 of the projection table 100. The image of the 2D layout 190 now comprises an image of a displayed bundle route 250 that is the image of the first bundle 200 being routed. Because FIG. 2B depicts the first bundle 200 already routed on the projection table 100, the first bundle 200 and the image of the displayed bundle route 250 are superposed and look as one. The bundle 200 being routed comprises two end points 205, namely a first end point 210 and a second end point 220. Other end points 230 are the end points of bundles that remain to be routed at this time.

The displayed bundle route 250 extends from the first end point 210 to the second end point 220. The displayed bundle route 250 is what is optically projected on the projection table 100 by the projector 150, and this optically projected bundle route 250 indicates to a worker who is assembling the harness which bundle 200 is ready to be routed and where it has to be placed on the projection table 100. The worker is then able to place one of the bundles 200 on the projection table 100 exactly over the displayed bundle route 250.

Once the first bundle 200 has been placed on the displayed bundle route 250, the method described herein proceeds with projecting a new bundle route on the projection table 100. This next step is triggered either by the worker manually activating the projection of the new bundle route 250, or by having a step of automatically projecting the next bundle route 250, either by detecting that the worker has completed the first step or after a given time duration. This new route involves at least one of the other end points 230 and a new bundle among the bundles 200. Thus, the manufacturing of the harness 195 corresponds to the assembly of many bundles 200 sequentially placed over an organized succession of displayed bundle routes 250.

Figure 3:
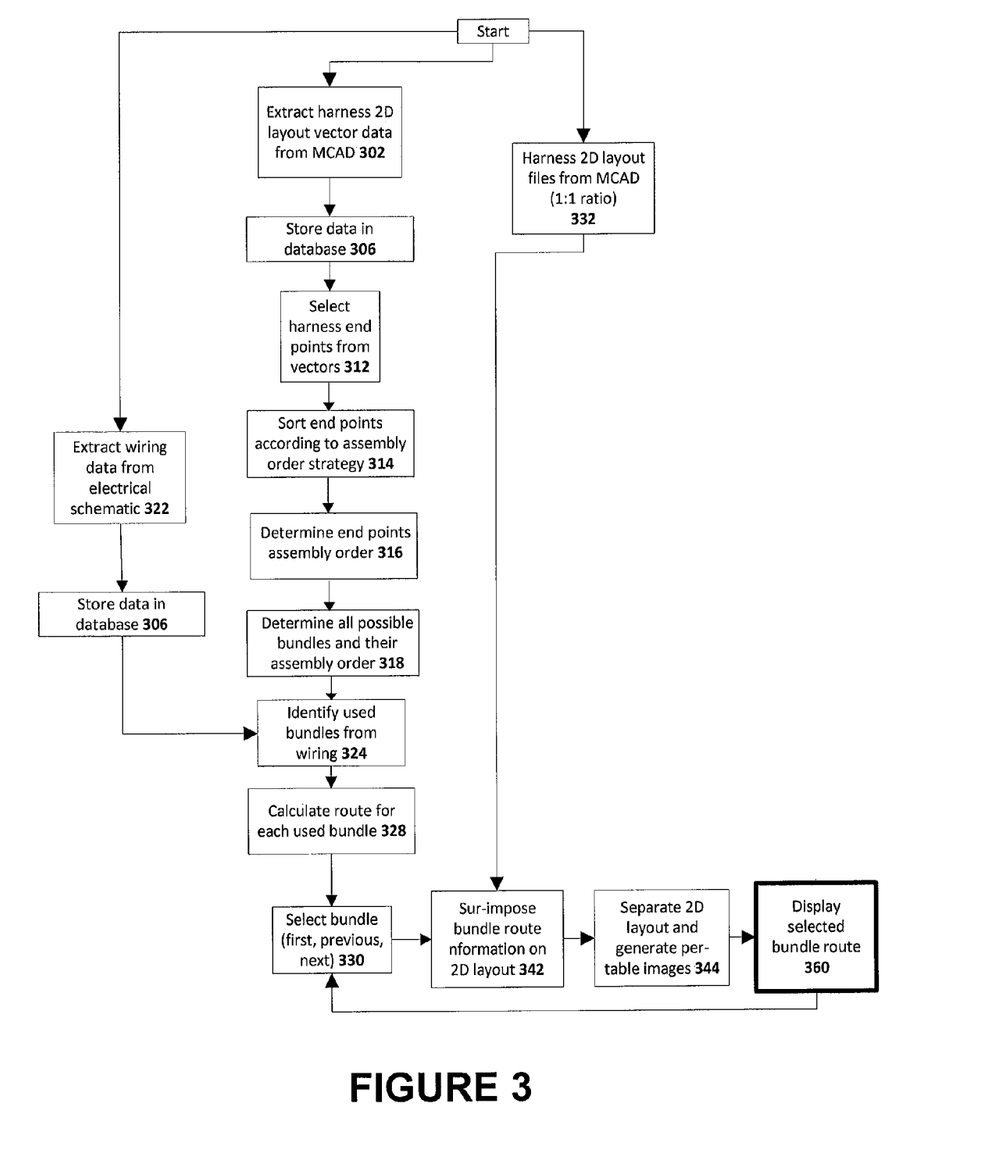
FIG. 3 is a block diagram illustrating the method for transposing 2D layout from a CAD software into ordered bundle routes for projecting on the projection table of FIG. 1.

The method described herein and illustrated in FIG. 3, now referred to, generates the 2D layout for each bundle route 250 displayable by the projector 150 in a preferred order for assembling the bundles 200 into the harness 195.

The method first requires a data extraction 302 from a CAD software tool for generating three-dimensional models, such as CATIA, or any other type of tool in which a model of the harness may be contained. A developed 2D layout from a 3D CAD model of the harness 195 to be manufactured is generated in the CAD software. The harness data extraction 302, which may be implemented by software, extracts vectors originating from the 2D layout. Each vector consists of two points. Each point is defined by a name and its x and y coordinates. This data is then sent to a database 304 where it is stored for later retrieval and use (step 306).

Even though the coordinates can be simply received from the CAD model (or other type of model), there may exist situations in which the coordinates cannot simply be exported by the CAD software tool. In such cases, receiving the coordinates of the layout comprises generating or extracting the coordinates from the CAD model.

End points selection 312 determines the full extent of all end points in the harness 195. In the non-limiting example depicted in FIGS. 4A and 4E, now referred to, end point selection 312 determines that there are 5 different coordinates for end points 205 (P1 to P5). End point sorting 314 sorts the end points 205 by ascending X and Y coordinates. According to this embodiment, the end points 205 are sorted from the bottom left corner to the upper right corner of the projection table. Next, the method determines the end point assembly order 316. The end point assembly order 316 assigns the end points the name P1, P2, P3, P4 and P5 where the numeral in the end point name corresponds to the order in which the end point 205 will be dealt with. This end point assembly order 316 is determined so as to improve the pace of the manufacturing process of the harness 195.

Generally speaking, the coordinates define a first dimension and a second dimension (for example X and Y as mentioned above, although other 2D coordinates may be used, for example polar coordinates). These coordinates are defined in relation to a reference point (for example a corner of the projection table, or another point on the table, etc.). If Cartesian coordinates are used, the axes may be defined as going upward, downward, leftward, rightward, etc.

Subsequently, the bundle assembly sequence or order is determined (step 318). The sequence may be said to be predetermined because the sequence is determined before assembly has begun. This is achieved by calculating all the possible combinations of linking one end point 205 to one other end point 205. The number of possible combinations corresponds to the sum of integers from 1 to n−1. For example, in the present case, the number of possible combinations equals 10:

1. P1-P2
2. P1-P3
3. P1-P4
4. P1-P5
5. P2-P3
6. P2-P4
7. P2-P5
8. P3-P4
9. P3-P5
10. P4-P5

This list of possible combinations of end points 205 now defines, from 1 to 10, the sequence in which the bundles 200 will be assembled.

Briefly stated, the worker first assembles all the bundles 200 starting from end point P1 to end point P2. He then moves on to the bundle 200 from P1 to P3, from P1 to P4 and so on. Once all bundles 200 starting at P1 have been assembled, the worker then assembles the bundles starting at P2: P2-P3, P2-P4, and P2-P5. The worker then moves on to the bundles starting at P3, P4, etc., and assembles them similarly. Advantageously, a second worker may install the connectors at end point P1 while the first worker assembles the bundles 200 starting from end point P2, and so on.

Wiring data (e.g., a wiring list) is extracted at step 322 from an electrical schematic and stored in the database 304 for later processing (step 323).

Figure 4:
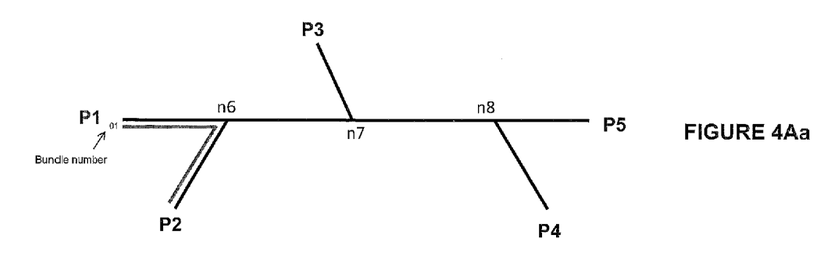
FIG. 4A is a schematic diagram illustrating a harness under assembly on the projection table in accordance with an embodiment.
FIG. 4B is a schematic diagram illustrating the harness under assembly described in FIG. 4A at a further step in the assembly process.
FIG. 4C is a schematic diagram illustrating the harness under assembly described in FIG. 4B at a further step in the assembly process.
FIG. 4D is a schematic diagram illustrating the harness under assembly described in FIG. 4C at a further step in the assembly process.
FIG. 4E is a schematic diagram illustrating the harness under assembly described in FIG. 4D at a final step in the assembly process.
Figures 4, 4A:
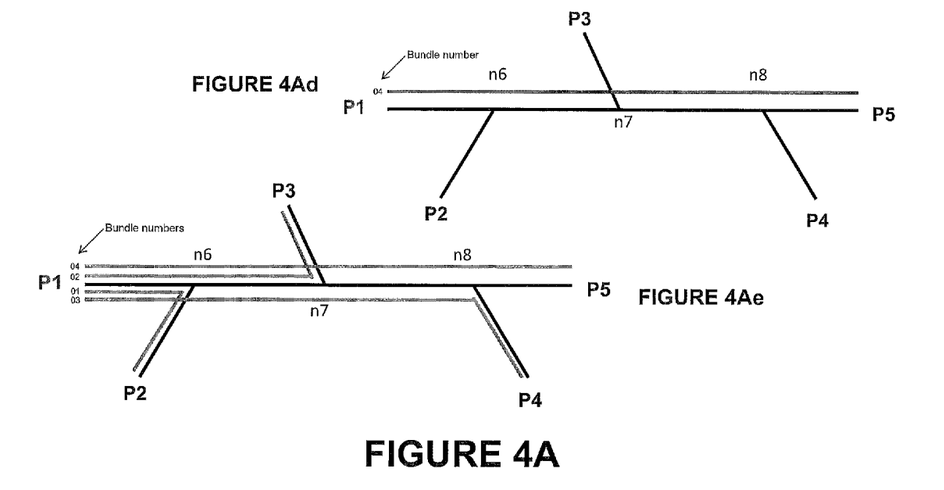
Figure 4C:
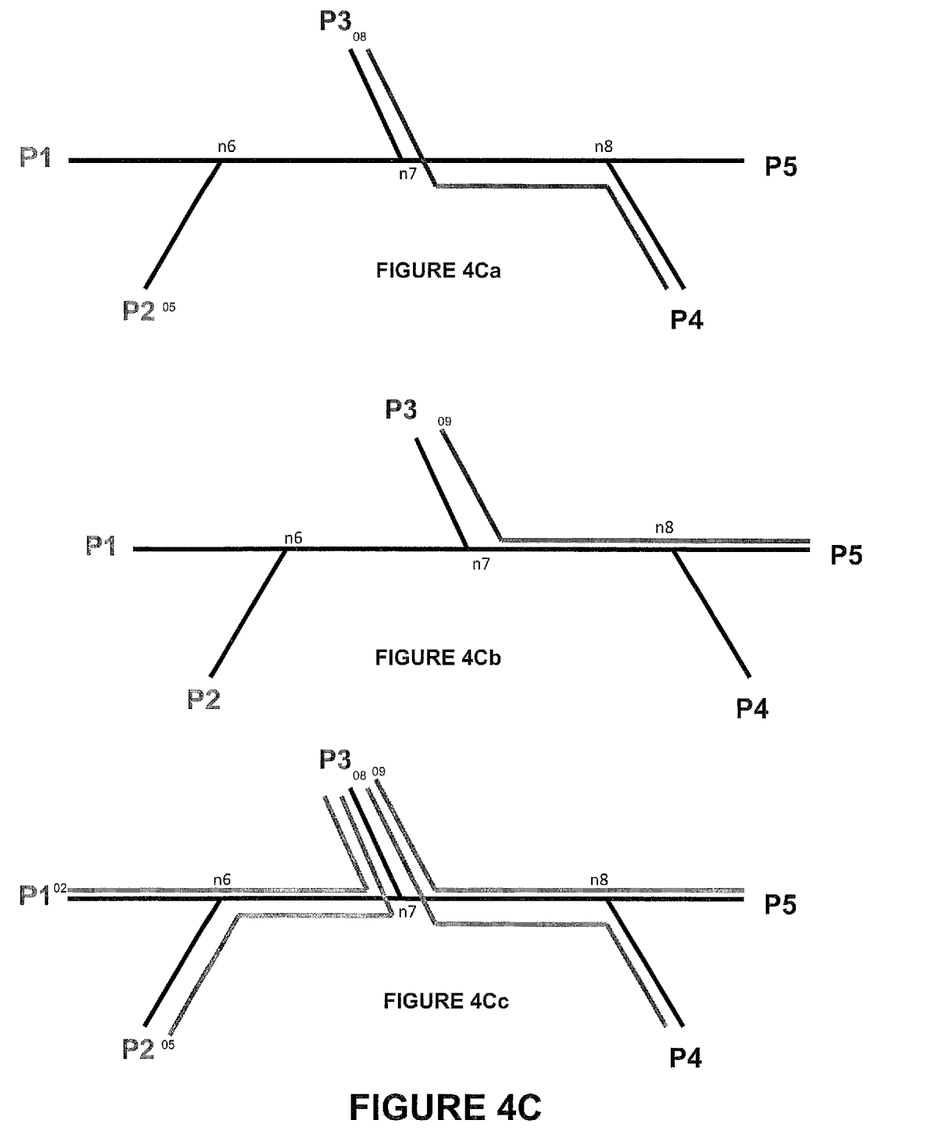
Figure 4E:
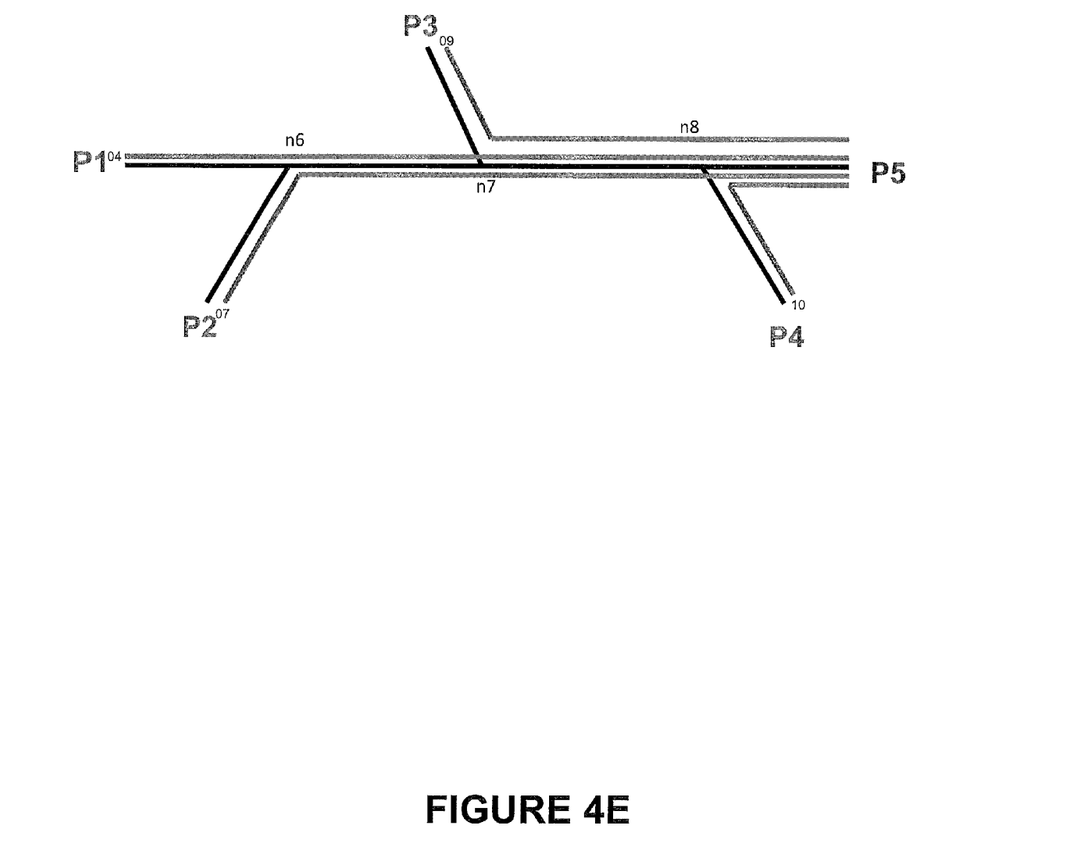

The bundles to be used are identified at step 324 according to wiring data extracted from an electrical schematic at step 322 and stored in the database. Depending on its starting point and ending point, each wire is sequenced according to the bundle assembly order 318. The bundle route calculation 326 determines the route used by each bundle based on the vectors providing the path which the bundles 200 must follow from their starting point to their ending point. For example, in FIG. 4Aa, the bundle route 250 for the bundle 200 starting at P1 and ending at P2 would be V1, V2. Similarly, the bundle route 250 for the bundle 200 starting at P1 and ending at P3 would be V1, V3, and V4. It should be noted that the highlighted route in the subfigures (4Aa, b, c, d etc.) are the current bundle routes 250.

At this point, all the information required to prepare the assembly 2D layouts 190 to be projected has been defined. At first, an empty image of the harness 332 is displayed on the projection table. The empty image of the harness is shown in FIG. 2A and corresponds to the finished harness 195 without any bundle route shown. If the image is too large for displaying on a single projection table 100, a series of projection tables 100 may be placed side-by-side. An image separation 344 splits the image according to the quantity of projection tables 100 required, thereby creating a corresponding series of split images. Each image of this series of split images is then either sent directly to the corresponding projector 150 or stored locally in each of the corresponding projection table's local computer 155 for display on the corresponding local projector 150. When the bundle route 250 is displayed over the empty image of the harness, as will be seen hereinbelow, the total image gets split in the same way as previously described.

When the worker is ready to start, he activates the display of the first bundle route 330 by adding the bundle route information 342. The result of bundle route information addition is shown in FIG. 4Aa. The worker installs/routes the first bundle by starting from end point P1, through intermediate point n6 and ending at end point P2. The worker then activates the display of the next bundle route 250, shown in FIG. 4Ab which runs from P1 to P3 through intermediate points n6 and n7. FIGS. 4Ac, 4Ad and 4Ae represent the subsequent steps to complete the assembly of bundles 200 starting at P1. Once this is completed, a second worker may simultaneously assemble or install a connector (aka terminal) at P1 (this step is also known as terminating) while the first worker starts assembling the bundles starting from P2. In the case shown in FIGS. 4Ba, 4Bb and 4Bc, it is possible to see that the bundle routes P2-P3, P2-P4, and P2-P5 are subsequently displayed and completed at FIG. 4Bd where once again, the second worker may complete the assembly of the connector at P2.

The assembly of a second connector at P2 may be performed while other bundles starting from P3 are being assembled, i.e., the routes P3-P4 and then P3-P5, as illustrated in FIGS. 4Ca and 4Cb. Finally, while a third connector is being assembled by the second worker at P3 (FIG. 4Ce), the last route P4-P5 may be assembled by the first worker, as seen on FIG. 4Da. Thereafter, the second worker may install a fourth connector at the end P4 (FIG. 4Db) and a fifth connector at P5 (FIG. 4E) once all the bundles have been placed correctly.

In the previous example in relation with FIGS. 4A to 4E, the harness 195 comprised five end points P1 to P5, but the method described would still apply if there were more or less end points. It is to be understood that this is only an example and a harness could be manufactured with the present method that would have any combination of bundles 200 and of end points 205, including harnesses where not all possible combination of bundle routes are present. This cycle keeps going on until all bundles have been assembled to form the harness and all connectors have been installed at the end points. The harness is then ready for testing and packaging.

The computer-implemented method for defining a sequence of the bundles for assembling them into a harness may be summarized as follows. The defined sequence for assembling bundles into a wire harness requires receiving coordinates of the end points of each bundle making up the harness either directly from a CAD software or through an intermediate database. To generate the optimized order from the coordinates, the first and second dimension coordinates of the first and second ends of each bundle are used. The bundles are sorted in an ascending order of the first dimension coordinate of the first end of each one of the bundles. Then, for those bundles which have the same first dimension coordinate of the first end, those bundles are sorted in an ascending order of the second dimension coordinate of the first end. For those bundles which have the same first dimension coordinate and the same second dimension coordinate of the first end, those bundles are sorted in an ascending order of the first dimension coordinate of the second end. Finally, for those bundles which have the same first dimension coordinate and the same second dimension coordinate of the first end, and the same first dimension coordinate of the second end, those bundles are sorted in an ascending order of the second dimension coordinate of the second end. The resulting sequential order of the bundles defines the assembly order of the bundles.

In another embodiment, the sequence is defined based on the path length. For example, the sequence is defined in order of ascending path length. This case may lead to the same sequence as in the last paragraph.

Still referring to FIG. 3, since the method described herein is a manufacturing method, it may be used by a manufacturing organization comprising more than just one production plant, the plants being connected to a central server on which the database 304 is stocked. In that case, there may be a site selection 306. Since the database 304 may comprise plans for more than just one harness, this is followed by a harness selection 308.

Figure 5:
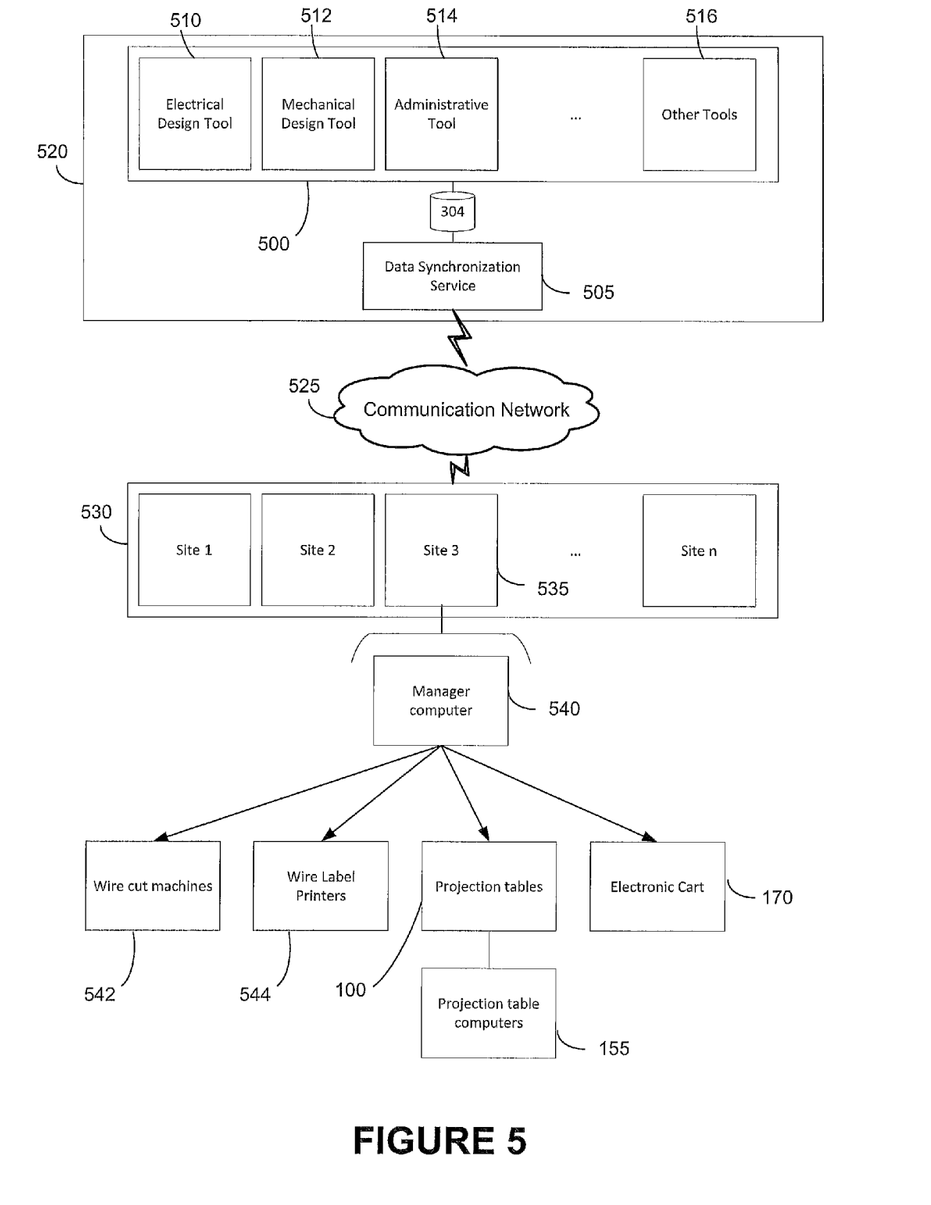
FIG. 5 is a block diagram illustrating interaction between the method described herein and other engineering and manufacturing tools in accordance with an embodiment.

According to an embodiment, the method described herein may be fully integrated in a complete engineering or manufacturing toolset. FIG. 5 illustrates an embodiment of such integration among the various tools found in the engineering and manufacturing environment of the organization.

The engineering toolset 500 may comprise, for example, an electrical design tool 510 (which, in an embodiment, comprises the method described herein), a mechanical design tool 512, an administration tool 514 or any other tool 516 useful for the functioning of the organization.

The engineering toolset 500 is stored in a server 520, the server lying in a server location. The server 520 may receive information from various work centers or sites 530 (that may be remote to the server location according to an embodiment) and may thus comprise a data synchronization service 505. However, once the data is stored in the server, its main function is to send information to the various sites 530. Communications are performed through a communication network 525.

The selected site 535 may comprise a manager computer 540 dealing with both the server 520 and the equipment of the site. The equipment of the site may comprise wire cut machines 542 to cut wires according to the design, wire label printers 544 for an automated identification of the wires, projection tables 100, a projection table computer 155 and an electronic cart 170. This equipment receives instruction from the server 520 through the manager computer 540 and performs its specific task to respect the electrical design.

Hardware and Operating Environment

Figure 6:
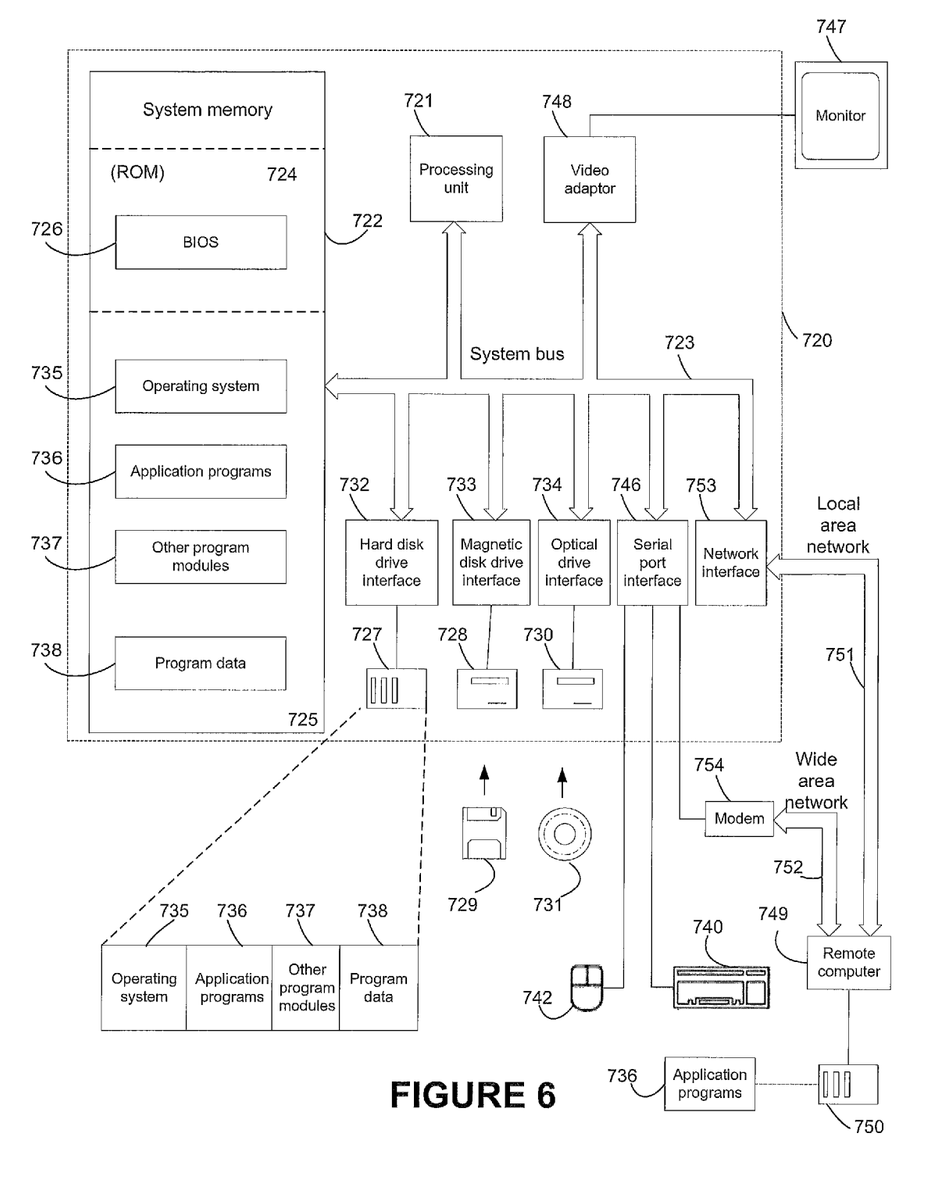
FIG. 6 is an exemplary diagram illustrating a suitable computing operating environment in which embodiments may be practiced.

The part of the method described in relation with FIG. 3 may be fully appreciated when implemented in a computing operating environment. FIG. 6 illustrates an exemplary diagram of a suitable computing operating environment in which embodiments described herein may be practiced. The following description is associated with FIG. 6 and is intended to provide a brief, general description of suitable computer hardware and a suitable computing environment in conjunction with which the embodiments may be implemented. Not all the components are required to practice the embodiments, and variations in the arrangement and type of the components may be made without departing from the spirit or scope of the embodiments.

Although not required, the embodiments are described in the general context of computer-executable instructions, such as program modules, being executed by a computer, such as a personal computer, a hand-held or palm-size computer, Smartphone, or an embedded system such as a computer in a consumer device or specialized industrial controller. Generally, program modules include routines, programs, objects, components, data structures, etc., that perform particular tasks or implement particular abstract data types.

Moreover, those skilled in the art will appreciate that the embodiments may be practiced with other computer system configurations, including hand-held devices, multiprocessor systems, microprocessor-based or programmable consumer electronics, network PCS, minicomputers, mainframe computers, cellular telephones, smart phones, display pagers, radio frequency (RF) devices, infrared (IR) devices, Personal Digital Assistants (PDAs), laptop computers, wearable computers, tablet computers, a device of the IPOD or IPAD family of devices manufactured by Apple Computer, integrated devices combining one or more of the preceding devices, or any other computing device capable of performing the methods and systems described herein. The embodiments may also be practiced in distributed computing environments where tasks are performed by remote processing devices that are linked through a communications network. In a distributed computing environment, program modules may be located in both local and remote memory storage devices.

The exemplary hardware and operating environment of FIG. 6 includes a general purpose computing device in the form of a computer 720, including a processing unit 721, a system memory 722, and a system bus 723 that operatively couples various system components including the system memory to the processing unit 721. There may be only one or there may be more than one processing unit 721, such that the processor of computer 720 comprises a single central-processing unit (CPU), or a plurality of processing units, commonly referred to as a parallel processing environment. The computer 720 may be a conventional computer, a distributed computer, or any other type of computer; the embodiments are not so limited.

The system bus 723 may be any of several types of bus structures including a memory bus or memory controller, a peripheral bus, and a local bus using any of a variety of bus architectures. The system memory may also be referred to as simply the memory, and includes read only memory (ROM) 724 and random access memory (RAM) 725. A basic input/output system (BIOS) 726, containing the basic routines that help to transfer information between elements within the computer 720, such as during start-up, is stored in ROM 724. In one embodiment, the computer 720 further includes a hard disk drive 727 for reading from and writing to a hard disk, not shown, a magnetic disk drive 728 for reading from or writing to a removable magnetic disk 729, and an optical disk drive 730 for reading from or writing to a removable optical disk 731 such as a CD ROM or other optical media. In alternative embodiments, the functionality provided by the hard disk drive 727, magnetic disk 729 and optical disk drive 730 is emulated using volatile or non-volatile RAM in order to conserve power and reduce the size of the system. In these alternative embodiments, the RAM may be fixed in the computer system, or it may be a removable RAM device, such as a Compact Flash memory card.

In an embodiment, the hard disk drive 727, magnetic disk drive 728, and optical disk drive 730 are connected to the system bus 723 by a hard disk drive interface 732, a magnetic disk drive interface 733, and an optical disk drive interface 734, respectively. The drives and their associated computer-readable media provide nonvolatile storage of computer-readable instructions, data structures, program modules and other data for the computer 720. It should be appreciated by those skilled in the art that any type of computer-readable media which can store data that is accessible by a computer, such as magnetic cassettes, flash memory cards, digital video disks, Bernoulli cartridges, random access memories (RAMs), read only memories (ROMs), and the like, may be used in the exemplary operating environment.

A number of program modules may be stored on the hard disk, magnetic disk 729, optical disk 731, ROM 724, or RAM 725, including an operating system 735, one or more application programs 736, other program modules 737, and program data 738. A user may enter commands and information into the personal computer 720 through input devices such as a keyboard 740 and pointing device 742. Other input devices (not shown) may include a microphone, joystick, game pad, satellite dish, scanner, touch sensitive pad, or the like. These and other input devices are often connected to the processing unit 721 through a serial port interface 746 that is coupled to the system bus, but may be connected by other interfaces, such as a parallel port, game port, or a universal serial bus (USB). In addition, input to the system may be provided by a microphone to receive audio input.

A monitor 747 or other type of display device is also connected to the system bus 723 via an interface, such as a video adapter 748. In one embodiment, the monitor comprises a Liquid Crystal Display (LCD). In addition to the monitor, computers typically include other peripheral output devices (not shown), such as speakers and printers. The monitor may include a touch sensitive surface which allows the user to interface with the computer by pressing on or touching the surface.

The computer 720 may operate in a networked environment using logical connections to one or more remote computers, such as a remote computer 749. These logical connections are achieved by a communication device coupled to or a part of the computer 720; the embodiment is not limited to a particular type of communications device. The remote computer 749 may be another computer, a server, a router, a network PC, a client, a peer device or other common network node, and typically includes many or all of the elements described above relative to the computer 720, although only a memory storage device 750 has been illustrated in FIG. 6. The logical connections depicted in FIG. 6 include a local-area network (LAN) 751 and a wide-area network (WAN) 752. Such networking environments are commonplace in offices, enterprise-wide computer networks, intranets and the Internet.

When used in a LAN-networking environment, the computer 720 is connected to the local network 751 through a network interface or adapter 753, which is one type of communications device. When used in a WAN-networking environment, the computer 720 typically includes a modem 754, a type of communications device, or any other type of communications device for establishing communications over the wide area network 752, such as the Internet. The modem 754, which may be internal or external, is connected to the system bus 723 via the serial port interface 746. In a networked environment, program modules depicted relative to the personal computer 720, or portions thereof, may be stored in the remote memory storage device. It is appreciated that the network connections shown are exemplary and other means of and communications devices for establishing a communications link between the computers may be used.

The hardware and operating environment in conjunction with which embodiments may be practiced has been described. The computer in conjunction with which embodiments may be practiced may be a conventional computer a hand-held or palm-size computer, a computer in an embedded system, a distributed computer, or any other type of computer; the embodiments are not so limited. Such a computer typically includes one or more processing units as its processor, and a computer-readable medium such as a memory. The computer may also include a communications device such as a network adapter or a modem, so that it is able to communicatively couple other computers.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A method for assembling a wire harness on a display surface, the wire harness being made of bundles, each one of the bundles corresponding to a bundle route selected among possible bundle routes, each one of the possible bundle routes comprising a first end and a second end, the method comprising:
  receiving coordinates of a layout of the wire harness, the receiving coordinates comprising receiving coordinates of the first end and of the second end for each one of the possible bundle routes, the coordinates comprising, for each first end and for each second end, a first dimension coordinate and a second dimension coordinate in relation to a reference point;
  generating at least a portion of all the possible bundle routes by identifying coordinates of the first end and of the second end for each one of the at least a portion of all the possible bundle routes using the coordinates of the layout of the wire harness;
  receiving wiring data which identifies the bundles to be used for the wire harness;
  determining which bundle routes among the possible bundle routes correspond to the bundles to be used;
  defining, from the coordinates of the first end and the second end of each one of the determined bundle routes, a routing sequence in which the bundles are to be routed in order to assemble the wire harness, the defining the routing sequence comprising:
    sorting the bundle routes according to the first dimension coordinate of their first end; then
    for those bundle routes having the same first dimension coordinate of their first end, sorting those bundle routes according to the second dimension coordinate of their first end; then
    for those bundle routes having the same first dimension coordinate and the same second dimension coordinate of their first end, sorting those bundle routes according to the first dimension coordinate of their second end; and then
    for those bundle routes having the same first dimension coordinate and the same second dimension coordinate of their first end, and the same first dimension coordinate of their second end, sorting those bundle routes according to the second dimension coordinate of their second end;
  generating a plurality of signals, each one of the plurality of signals being representative of an image of the bundle route for a corresponding one of the bundles to be routed; and
  sequentially sending each one of the plurality of signals for display on the display surface according to the defined routing sequence,
  wherein the sorting is in a logical order.

2. The method of claim 1, further comprising sending for display on the display surface a signal representative of an image of the harness without any bundle route.

3. The method of claim 1, wherein generating at least a portion of all the possible bundle routes comprises generating the possible bundle routes by identifying coordinates of intermediate points of the at least a portion of all the possible bundle routes from the coordinates.

4. The method of claim 3, wherein said generating the possible bundle routes further comprises defining vectors between at least one of:
  end points and intermediate points;
  two intermediate points; and
  two end points.

5. The method of claim 1, wherein said generating a plurality of signals comprises modifying each one of the plurality of signals into a plurality of secondary signals, each one of the plurality of secondary signals being representative of a different portion of the image of the bundle route, said method further comprising displaying said plurality of secondary signals on a corresponding plurality of display surfaces placed side-by-side and adjacently to each other.

6. The method of claim 1, wherein said sending the plurality of signals for display on the display surface comprises sending the plurality of signals for display on a projection table.

7. The method of claim 1, further comprising, after sending each one of the plurality of signals for display, routing a corresponding one of the bundles on the bundle route displayed on the display surface, wherein routing is performed by a worker.

8. The method of claim 7, wherein the wire harness further comprises ends, the method further comprising installing a terminal at one of the ends of the wire harness after all the bundles linked to the one of the ends of the wire harness have been routed.

9. The method of claim 1, wherein sending the plurality of signals for display comprises sending the plurality of signals from a computing device in a server location to a projector in a site, wherein the server location is remote from the site.

10. The method of claim 1, wherein receiving the coordinates comprises generating the coordinates.

11. The method of claim 1 wherein the sorting is made in one of an ascending order and a descending order.

12. A method for defining a routing sequence for routing bundles in order to assemble a wire harness on a display surface, the wire harness being made from the bundles, each one of the bundles corresponding to a bundle route, each one of the bundle routes comprising a first end and a second end, the method comprising:
  receiving coordinates of a layout of the wire harness, the receiving coordinates comprising receiving coordinates of the first end and of the second end for each one of the bundle routes, the coordinates comprising, for each first end and for each second end, a first dimension coordinate and a second dimension coordinate in relation to a reference point;

sorting the bundle routes according to the first dimension coordinate of their first end; then for those bundle routes having the same first dimension coordinate of their first end, sorting those bundle routes according to the second dimension coordinate of their first end; then for those bundle routes having the same first dimension coordinate and the same second dimension coordinate of their first end, sorting those bundle routes according to the first dimension coordinate of their second end; and then for those bundle routes having the same first dimension coordinate and the same second dimension coordinate of their first end, and the same first dimension coordinate of their second end, sorting those bundle routes according to the second dimension coordinate of their second end, wherein the sorting is in a logical order.

13. The method of claim 12 wherein the sorting is made in one of an ascending order coordinates and a descending order.

14. The method of claim 12, further comprising using a projector for optically projecting, on the display surface, one image representative of a bundle route at a time in the defined sequence.

15. A system for assembling a wire harness comprising a plurality of bundles to be routed, each one of the bundles being defined by a corresponding one bundle route, the system comprising:
   a display surface which comprises a surface on which the wire harness is assembled;
   a projector for projecting, for each one of the bundles to be routed, an image of the corresponding one bundle route on the display surface in a sequence in which the bundles are to be routed to assemble the wire harness; and
   a computing device for:
      determining, for each one of the bundles to be routed, the corresponding one bundle route;
      defining, from the coordinates of the first end and the second end of each one of the determined bundle routes, a routing sequence in which the bundles are to be routed in order to assemble the wire harness, the defining the routing sequence comprising:
         sorting the bundle routes according to the first dimension coordinate of their first end; then
         for those bundle routes having the same first dimension coordinate of their first end, sorting those bundle routes according to the second dimension coordinate of their first end; then
         for those bundle routes having the same first dimension coordinate and the same second dimension coordinate of their first end, sorting those bundle routes according to the first dimension coordinate of their second end; and then
         for those bundle routes having the same first dimension coordinate and the same second dimension coordinate of their first end, and the same first dimension coordinate of their second end, sorting those bundle routes according to the second dimension coordinate of their second end;
      sending to the projector, for each one of the bundles to be routed, a signal representative of an image of the corresponding one bundle route, wherein the sorting is in a logical order.

16. The system of claim 15, wherein the computing device is further operative to send a plurality of secondary signals for each bundle, each one of the plurality of secondary signals being representative of a different portion of the image of the corresponding one bundle route, each one of the plurality of secondary signals being adapted to be displayed on a corresponding plurality of display surfaces placed side-by-side and adjacently to each other.

17. The system of claim 15, wherein the computing device is located in a server location and the projector and the display surface are located in a site, the server location being remote from the site.

18. The system of claim 15, wherein the display surface comprises a projection table comprising a surface that is planar and substantially vertically positioned.

19. The system of claim 18, wherein the surface comprises two sides which are both used for assembling wire harnesses.

* * * * *

UNITED STATES PATENT AND TRADEMARK OFFICE
CERTIFICATE OF CORRECTION

PATENT NO. : 9,818,179 B2  
APPLICATION NO. : 14/097619  
DATED : November 14, 2017  
INVENTOR(S) : Luc Philbert Page 1 of 1

It is certified that error appears in the above-identified patent and that said Letters Patent is hereby corrected as shown below:

Column 15, Line 20, Claim 13, after "order" delete "coordinates"

Signed and Sealed this  
Twentieth Day of February, 2018

Andrei Iancu  
*Director of the United States Patent and Trademark Office*